US008527668B2

(12) United States Patent
DiBartolomeo et al.

(10) Patent No.: US 8,527,668 B2
(45) Date of Patent: Sep. 3, 2013

(54) PRIORITY LOGIC MODULE

(75) Inventors: John A. DiBartolomeo, Providence, RI (US); Kevin Hudson, Corona, CA (US); Gary T. Hufton, Corbett, OR (US); Peter P. Kral, Irvine, CA (US); Ajay P. Mishra, Irvine, CA (US); Huan V. Nguyen, Anaheim, CA (US); Francis W. Walker, Jr., Mission Viejo, CA (US)

(73) Assignee: Invensys Systems, Inc., Foxboro, MA (US)

( * ) Notice: Subject to any disclaimer, the term of this patent is extended or adjusted under 35 U.S.C. 154(b) by 405 days.

(21) Appl. No.: 12/945,660

(22) Filed: Nov. 12, 2010

(65) Prior Publication Data

US 2012/0124255 A1    May 17, 2012

(51) Int. Cl.
*G06F 3/00*     (2006.01)
*G21C 15/00*    (2006.01)
*G21C 19/28*    (2006.01)
*G06F 13/368*   (2006.01)

(52) U.S. Cl.
USPC .............................. 710/14; 376/245; 710/123

(58) Field of Classification Search
USPC .................................. 710/14, 123; 376/245
See application file for complete search history.

(56) References Cited

U.S. PATENT DOCUMENTS

| 6,324,676 | B1 * | 11/2001 | Burnham et al. ............. 716/117 |
| 6,842,669 | B2 | 1/2005 | Bednar et al. |
| 7,084,660 | B1 * | 8/2006 | Ackaret et al. ........... 324/762.02 |
| 2004/0010324 | A1 * | 1/2004 | Bednar et al. .................... 700/6 |

OTHER PUBLICATIONS

Partial European Search Report, Application No. 11188718.8 dated Mar. 23, 2012, 6 pages.

* cited by examiner

*Primary Examiner* — Farley Abad
(74) *Attorney, Agent, or Firm* — Edward S. Jarmolowicz, Esq.

(57) ABSTRACT

In a nuclear process control system, a priority logic module (PLM) is provided. The priority logic module comprises a plurality of input ports, each input port associated with one of a plurality of priorities, a plurality of output ports, and a test mode select port associated with a test mode select signal. The test mode select signal selects one of a normal mode or test mode, each mode being associated with matching signals received by the input ports to signals sent by the output ports. The priority logic module further comprises a configurable priority logic circuit, wherein the priority logic circuit maps one of the input ports to one of the output ports.

16 Claims, 6 Drawing Sheets

PRIORITY LOGIC MODULE

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Nuclear power plants are complex systems that may have a variety of sensors monitoring process parameters such as, for example, temperature, pressure, flow and neutron flux, and control systems issuing commands to controllers, safety logic circuitry, or safety actuation systems. The nuclear environment is subject to a variety of regulations mandating tight safety measures. For instance, the safety measures comprise combining diverse instrumentation, separating safety and non-safety equipment, hardware redundancy, etc. Typically, for each property and/or parameter measured, signals from three to four independent sensors are collected during plant operation. The signals are processed and used to monitor performance, to verify the correct operation of the associated instrumentation and to detect process anomalies. The priority logic module (PLM) is a logic component placed between initiating safety and/or control systems and a plurality of actuating devices coupled to the safety and/or control systems. The PLM receives safety and/or non-safety commands and arbitrates between them, responding to conflicting instructions by selecting a priority command signal from a plurality of device actuation commands.

SUMMARY

In an embodiment, in a nuclear process control system, a priority logic module (PLM) is disclosed. The priority logic module comprises a plurality of input ports, each input port associated with one of a plurality of priorities, a plurality of output ports, and a test mode select port associated with a test mode select signal. The test mode select signal selects one of a normal mode or test mode, each mode being associated with matching signals received by the input ports to signals sent by the output ports. The priority logic module further comprises a configurable priority logic circuit, wherein the priority logic circuit maps one of the input ports to one of the output ports.

In an embodiment, in a nuclear process control system, a priority logic module is disclosed. The priority logic module comprises a plurality of input ports and an output port, a pre-programmed priority logic circuit, wherein the priority logic circuit maps one of the input ports to the output port, and a programmability inhibitor coupled to the priority logic circuit, wherein the programmability inhibitor disables a programming function of the priority logic circuit.

In an embodiment, a method for testing is disclosed. The method comprises selecting a test mode from a test mode select signal and receiving a plurality of input signals, wherein each input signal is a class 1E signal associated with a priority. The method further comprises producing at least one output signal from the input signals, producing an output signal from the lowest priority input signal, producing a test output signal from the input signals, sending the output signal to an actuating device, and sending the test output signal to a test device.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
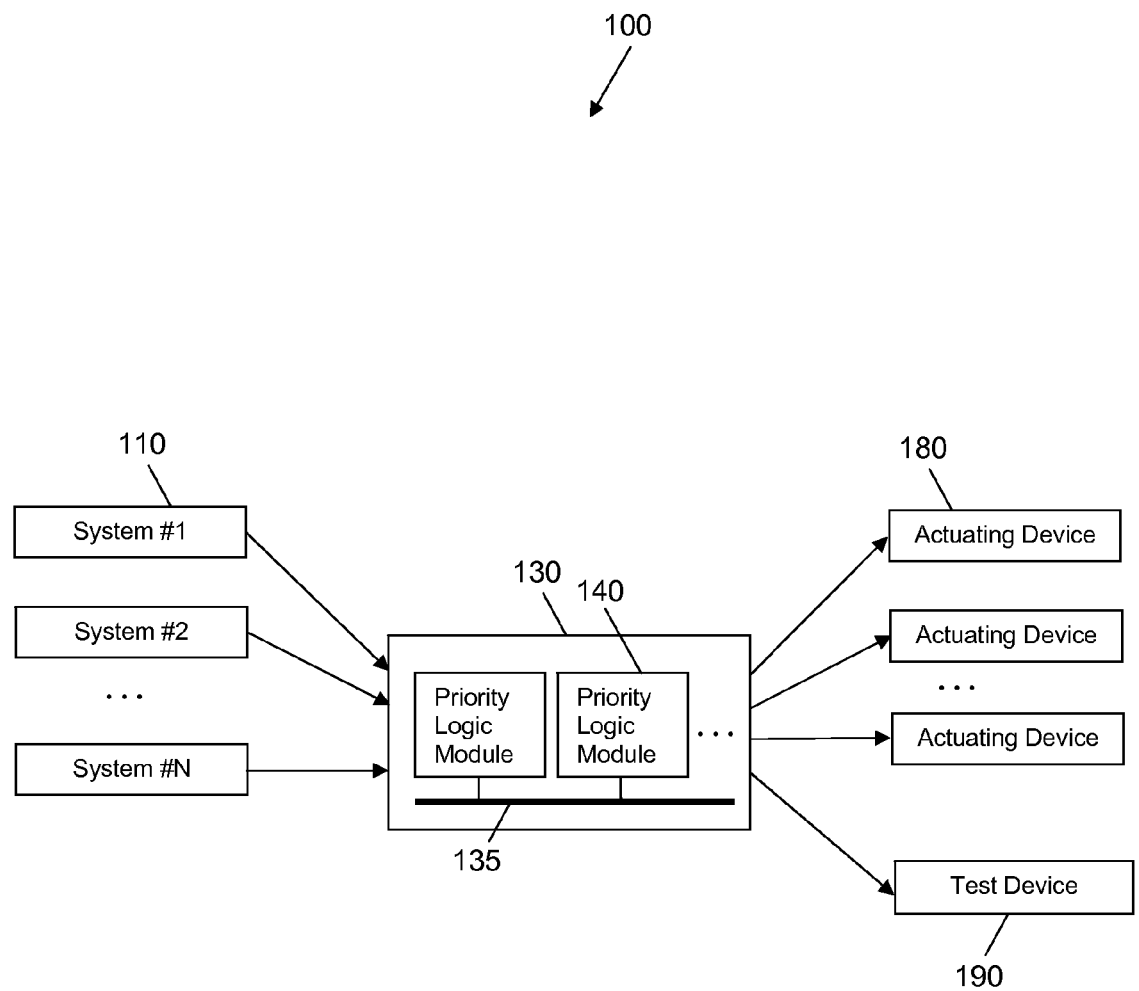
FIG. 1 is a block diagram of a process control system according to an embodiment of the disclosure

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

A priority logic module (PLM) implemented using a complex programmable logic device (CPLD) for use in high reliability automated process control applications is disclosed. The priority logic module may be employed, in an embodiment, in a class 1E nuclear process control system. The priority logic module receives a plurality of inputs and, based on prioritizing logic, generates a single control output from the inputs. For example, based on four different inputs, the priority logic module either signals activation of a solenoid or signals deactivation of the solenoid. The inputs may comprise one or more manual override inputs and one or more automated process control inputs. The priority logic module further receives a test mode input that may place the priority logic module in a test operation mode.

Implementing the priority logic module in a complex programmable logic device promotes reduction of certification costs associated with changing the priority logic. Priority logic may be different depending upon the specific control function being provided. For example, the priority logic for controlling reactor control rods may be different from priority logic controlling a coolant valve. If the two different logical functions were implemented in a first application specific integrated circuit (ASIC) and a second application specific integrated circuit, it may be necessary to perform complete independent certification testing on both application specific integrated circuits. Such certification testing may be very expensive and time consuming and may entail physical tests such as a radiation test, an environmental test, a seismic test, a conducted emissions test, a radiated emissions test, and others. Because the same hardware item, a given complex programmable logic device, may be used to implement different priority logic by reprogramming, the CPLD implemented priority logic module can be certified once and different priority logic functionality programming can be supported by a much less expensive and time consuming change impact analysis document.

In an embodiment, the priority logic module deters attempts to either reprogram or pirate the priority logic module in the field by grounding a programming clock and packaging the priority logic module within an enclosure. For example, when the priority logic module is manufactured and is completing its assembly, a final step may include grounding the programming clock and enclosing the priority logic module. This supports the regulatory stricture that a priority logic module for use in a class 1E nuclear environment not be field programmable. On the other hand, the priority logic module taught by the present disclosure promotes ease of reprogramming in the manufacturing and/or development laboratory environment. For example, the priority logic module may be rapidly and conveniently reprogrammed by developers to evolve a programming design or logic design in typical test-revise cycle. The priority logic module promotes reading out an identification of the logic version which supports engineering development.

The priority logic module supports a testing operation mode that provides for continued control of a high reliability field device, for example a solenoid, while concurrently testing the priority logic. For example, in the testing operation mode, a low priority input may drive the output controlling the field device while the three highest priority inputs drive a test output in accordance with the priority logic that prevails during normal operation mode.

FIG. 1 shows an embodiment of a Process Control System 100 comprising a plurality of Input Systems 110, a Priority Logic Component 130 comprising at least one PLM 140 coupled to a Baseplate 135, at least one Actuating Device 180 and a Test Device 190. In an embodiment, the PLM 140 may comprise a CPLD for which the programmability may have been disabled. In another embodiment, the PLM 140 may comprise a Field Programmable Gate Array (FPGA) for which the programmability may have been disabled. In an embodiment, four PLMs 140 may be coupled to the Baseplate 135.

In an embodiment, the PLM 140 may be certified for use in a class 1E nuclear process control system, wherein class 1E is defined as the safety classification of the electrical equipment and systems that are essential to emergency reactor shutdown. In an embodiment, the certification for use in a 1E nuclear process control system may comprise compliance with the Electronic Power Research Institute (EPRI) Technical Results (TR) 107330 standard. The PLM 140 may operate in compliance with a plurality of standards. For example, in some embodiments, the PLM 140 may comply with the requirements of one or more of the following standards: The Institute of Electrical and Electronics Engineers (IEEE) 1012 standard for Software Verification and Validation, the International Electrotechnical Commission (IEC) 61513, the IEC 60880, the Nuclear Regulatory Commission (NRC) Regulations and Guidance (RG) 1.180, and the NRC Digital Instrumentation & Controls Interim Staff Guidance DI&C-ISG-04.

The certification of control devices for use in a 1E nuclear process control system may involve one or more of the following tests. A radiation test may be performed where the PLMs 140 coupled to the Baseplate 135 are placed in a chamber and radiated with Gamma rays. An environmental test may be performed where the PLM 140 is placed in a chamber and subjected to extremes of temperature and humidity. A seismic test may be performed where the PLM 140 is bolted to a test fixture and shaken to simulate five big earthquakes and one very extreme earthquake.

A conducted emissions test may be conducted while the PLM 140 is operating such that the wires connected to the PLM 140 are tested for noise coming out of them that could affect other equipment. A radiated emissions test may be conducted while the PLM 140 is operating. A conducted susceptibility test may be performed in which noise is injected into the wires connected to the PLM 140 while it is operating to see if the PLM 140 can continue to operate correctly under this condition. A radiated susceptibility test may be performed in which radio frequency noise is radiated across a broad frequency range while the PLM 140 is operating to see if the PLM 140 can continue to operate correctly under this condition. A magnetic field radiated susceptibility test may be performed in which strong magnetic fields are created around the PLM 140 while it is operating to see if the PLM 140 can continue to operate correctly under this condition.

An electrical fast transient-surge-ringwave test may be performed in which large voltage spikes or a series of voltage spikes are injected into the lines connected to the PLM 140 while it is operating to see if the PLM 140 can continue to operate correctly under this condition. An electrostatic discharge test may be performed in which large electrostatic charges are discharged one of into the metal parts of the PLM 140 or in the air proximate to the PLM 140 while it is operating to see if the PLM 140 can continue to operate correctly under this condition.

It will be appreciated that performing these and other tests may consume a considerable amount of time and money. It is to be noted that once a given complex programmable logic device has successfully passed the above identified tests it need not repeat these tests simply because the programmed logic of the complex programmable logic device has changed. When programming is changed, the changes to the PLM 140 may be supported simply by a change impact analysis document.

The Priority Logic Component 130 may receive a plurality of signals from the Input Systems 110 and may forward a plurality of signals to the PLM 140. The PLM 140 may generate a plurality of signals using normal mode logic or test mode logic, and the PLM 140 may forward the signals to Priority Logic Component 130. The Priority Logic Component 130 may send at least one of the signals to at least one Actuating Device 180, and the PLM 140 may send one of the signals to a Test Device 190. In an embodiment, the Baseplate 135 provides connectivity between the Input Systems 110 and the PLM 140 and between the PLM 140 and the actuating device 180 or actuating devices 180. In an embodiment, the Baseplate 135 may provide redundant power sources for use by the one or more PLMs 140.

Figure 2:
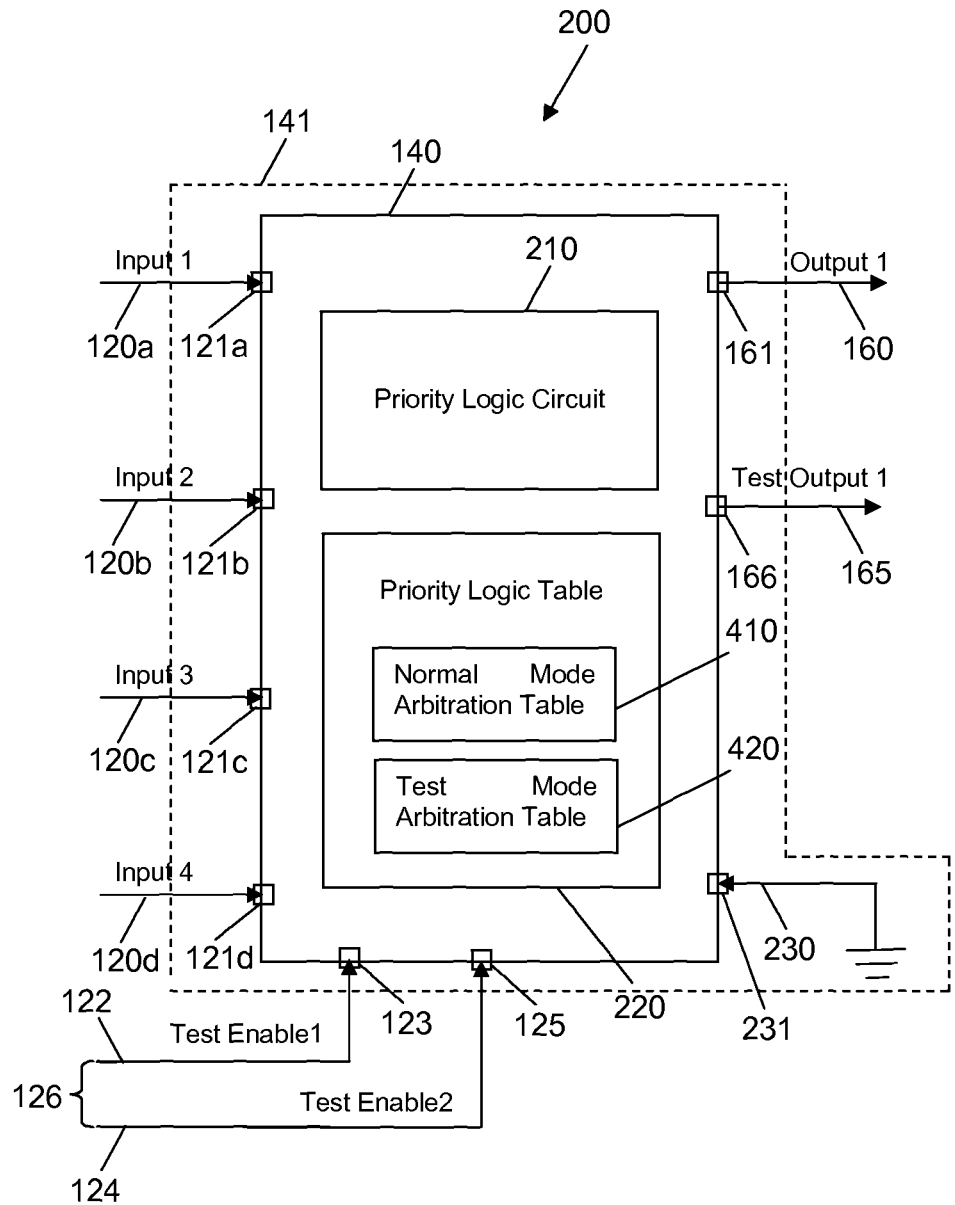
FIG. 2 is a block diagram of a priority logic module (PLM) architecture according to an embodiment of the disclosure.

FIG. 2 shows an embodiment of a PLM Architecture 200 comprising the PLM 140, an enclosure 141, a plurality of Inputs 120, an Output 160, and a Test Output 165. Each Input 120 is associated with an Input Port 121; the Output 160 is associated with an Output Port 161; and the Test Output 165 is associated with a Test Output Port 166. The PLM Architecture 200 further comprises a Test Mode Select 126 comprising a Test Enable1 122 signal associated with a Test Enable1 Port 123 and a Test Enable2 124 signal associated with a Test Enable2 Port 125. The PLM Architecture 200 further comprises a Priority Logic 220 comprising a Normal Mode Arbitration Logic Table 410 and a Test Mode Arbitration Logic Table 420. The PLM Architecture 200 further comprises a Programming Port Clock Input 230 associated with a Programming Port 231. In an embodiment, the Inputs 120 may comprise class 1E signals generated by class 1E devices.

In an embodiment, the enclosure 141 may comprise a device, for example a box or a cover, that prevents access to the PLM 140. Each Input Port 121 may be associated with a priority, for example by logic programmed into the PLM 140. As used herein, the term "highest priority input port" denotes "input port associated with the highest priority", the term "second highest priority input port" denotes "input port associated with the second highest priority", the term "third highest priority input port" denotes "input port associated with the third highest priority", the term "lowest priority input port" denotes "input port associated with the lowest priority", etc. The PLM 140 may execute an arbitration scheme to arbitrate between the Inputs 120, selecting at least one Input 120 to produce the Output 160 and the Test Output 165, based on the priorities associated with the Input Ports 121. It is understood that the priority among the inputs, and hence the ascription of the term "highest priority input port," "second highest priority input port," etc., to specific Input Ports 121 may change based on programming of the PLM 140.

Priority logic may be changed for a variety of reasons. For example, the priority logic may be changed because the control strategy and/or control policy associated with a particular field device may change. Alternatively, the priority logic may be changed because the PLM 140 may be targeted for use with a different field device. As used herein, the concept of changing and/or reprogramming the priority logic of the PLM 140 includes the idea of programming a first priority logic into a first PLM 140 and programming a second priority logic into a second PLM 140, wherein both the first PLM 140 and the second PLM 140 may have been previously un-programmed and/or in the state in which they were received from the manufacturer of the complex programmable logic device.

In an embodiment, the PLM 140 may comprise four Input Ports 121a-d, each Input Port 121 configured to receive an Input 120. In the example illustrated in FIG. 2, Input Port 120a ('Input 1' in the drawing) is the signal associated with the highest priority input port, Input 120b ('Input 2' in the drawing) is the signal associated with the second highest priority input port, Input 120c ('Input 3' in the drawing) is the signal associated with the third highest priority input port, and Input 120d ('Input 4' in the drawing) is the signal associated with the lowest priority input port. The PLM 140 may further comprise an Output Port 161 configured to send an Output 160 ('Output 1' in the drawing) and a Test Output Port 166 configured to send a Test Output 165 ('Test Output 1' in the drawing). In an embodiment, in test mode, the PLM 140 may generate the Output 160 via normal mode logic from the lowest priority Input 120d and may generate the Test Output 165 from all the Inputs 120a-d using test logic. In an embodiment, in test mode, the PLM 140 may generate the Output 160 and the Test Output 165 using the Test Mode Arbitration Logic Table 420. In manual test mode, the PLM 140 may first perform a "No-Go" test by activating each Input 120 separately and generating only the Test Output 165. The PLM 140 may then perform a "Go" test by activating each Input 120 separately and verifying the activation of the Actuating Devices 180 associated with the respective Outputs 160.

In an embodiment, the priorities associated with the Input Ports 121a-d may be programmable in a setting where the PLM 140 is assembled but not programmable in a field setting, for example in a power plant or in a manufacturing plant where the PLM 140 is used to control field devices. The PLM 140 may be assembled to disable a programmability feature. For example, a programming clock pin of the PLM 140 may be grounded. In some contexts, this may be referred to as a programmability inhibitor. The present disclosure contemplates that in other embodiments the programmability inhibitor may be implemented with other structures and/or using other methods. In the assembly environment, however, an engineer or technician can readily re-enable the programmability feature and reprogram the prioritization logic. For example, the engineer may remove an enclosure, remove a ground coupled to a programming clock, for example a ground jumper or ground wire, and then reprogram the PLM 140, for example using a standard interface cable. In the field setting, however, without specialized tools, the enclosure may not be removable and hence access to reprogram the PLM 140 may not be possible. Alternatively, the enclosure may be removable in the field without special tools but enclosure removal may take an amount of time that is incompatible with covert tampering with the PLM 140. Additionally, without access to schematic diagrams of the complex programmable logic device and/or without sophisticated engineering knowledge of how the complex programmable logic device operates, an employee working in the field environment would not know how to enable the disabled programmability function of the PLM 140.

In an embodiment, the PLM 140 may be configured to receive a Test Mode Select 126 indicating manual test mode, the signal comprising the Test Enable1 122 signal and the Test Enable2 124 signal. The PLM 140 may further be coupled to the Programming Port Clock Input 230, which is configured to clock the Programming Port 231 through which the PLM may be programmed. In an embodiment, the Programming Port Clock Input 230 may be grounded to disable the programmability of the PLM 140. In an embodiment, the PLM 140 may comprise a CPLD comprising a Joint Test Action Group (JTAG) port, and the Programming Port Clock Input 230 may comprise the TCK signal.

Figure 3:
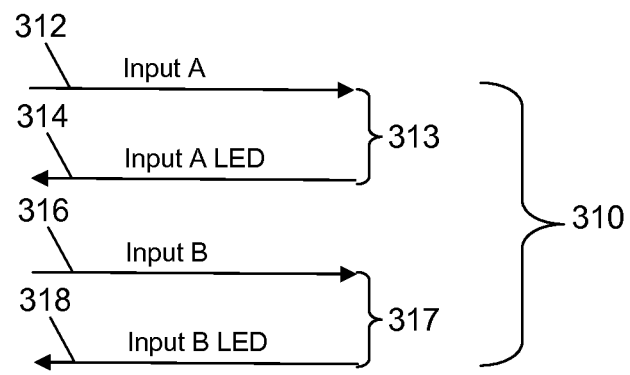
FIG. 3 illustrates an input/output structure according to an embodiment of the disclosure.
Figure 3:
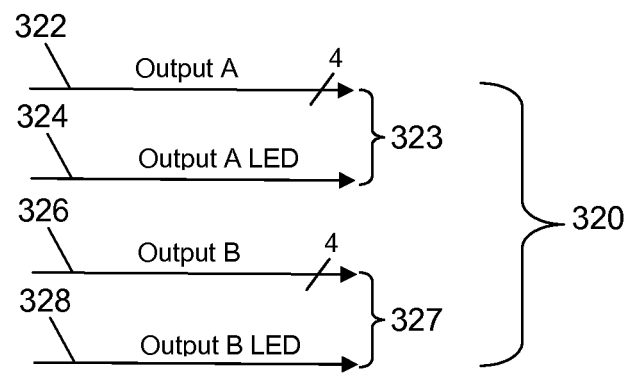
Figure 3:
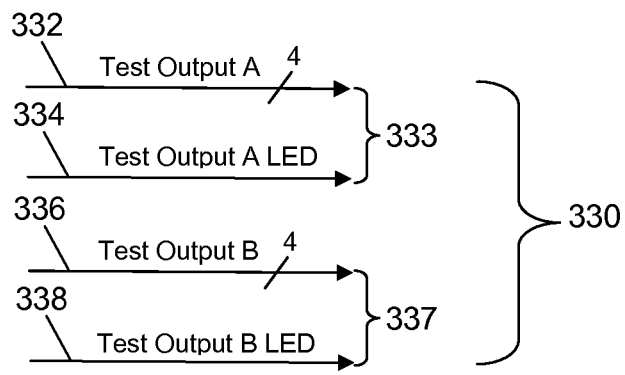

FIG. 3 shows an embodiment of an input/output structure. In an embodiment, each Input 120 may comprise an Input Pair 310 comprising two signals: In A 313 comprising Input A 312 and Input A LED 314, and In B 317 comprising Input B 316 and Input B LED 318. Input A LED 314 and Input B LED 318 may each comprise a semiconductor light source comprising a light emitting diode (LED) indicating when Input A 312 and/or Input B 316 are active, respectively. Input A 312 and Input B 316 may be generated by redundant instrumentation such as, for example by two independent sensors. The Test Mode Select 126 may comprise a structure similar to Input Pair 310, wherein the Test Enable1 122 and Test Enable2 124 signals may comprise the same structure as In A 313 and In B 317, respectively.

In an embodiment, the PLM 140 may be configured to receive four Input Pairs 310. In an embodiment, each Output 160 may comprise an Output Pair 320 comprising two signals: Out A 323 comprising Output A 322 and Output A LED 324, and Out B 327 comprising Output B 326 and Output B LED 328, wherein Output A LED 324 and Output B LED 328 may each comprise an LED signal indicating when the respective outputs are active. In an embodiment, Output A 322 and Output B 326 each comprise 4-bit signals. Each Test Output 165 may comprise a Test Output Pair 330 comprising two signals: Test Out A 333 comprising Test Output A 332 and Test Output A LED 334, and Test Out B 337 comprising Test Output B 336 and Test Output B LED 338, wherein Test Output A LED 334 and Test Output B LED 338 may each comprise an LED signal indicating when the respective outputs are active. In an embodiment, Test Output A 332 and Test Output B 336 each comprise a 4-bit signal.

Figure 4:
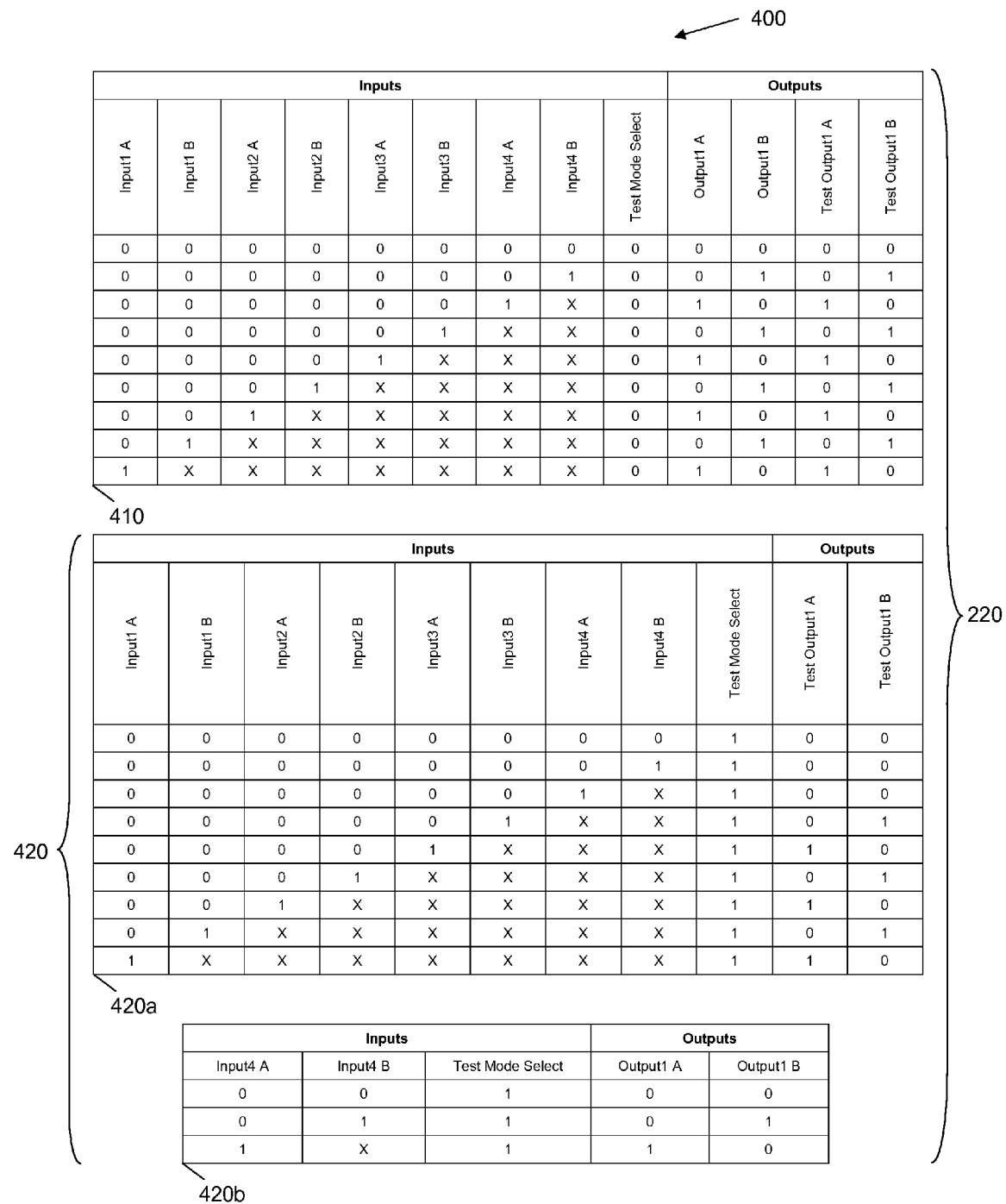
FIG. 4 illustrates the functional behavior of the priority logic according to an embodiment of the disclosure.

FIG. 4 illustrates an embodiment of the functional behavior of the PLM 140, represented in a Functional Behavior Table 400. The Functional Behavior Table 400 comprises a Normal Mode Arbitration Logic Table 410, a Test Mode Arbitration Logic Table A 420a and a Test Mode Arbitration Logic Table B 420b, wherein '1' indicates a '1' signal, '0' indicates a '0' signal and an 'x' indicates a <don't care>. It is understood that in an embodiment, the functional behavior represented by the Functional Behavior Table 400 may be implemented in a variety of ways, for example in very high definition language (VHDL) that is functional in nature and not based on a look-up table.

In an embodiment, the functional behavior of the PLM 140 in normal mode may be represented in the Normal Mode Arbitration Logic Table 410. For example, the output of the PLM 140 responsive to the inputs of the PLM 140 may be represented by the Normal Mode Arbitration Logic Table 410. The functional behavior of the PLM 140 with respect to the Test Outputs 330 in test mode may be represented by the Test Mode Arbitration Logic Table A 420a. The functional behavior of the PLM 140 with respect to Outputs 320 in test mode may be represented by the Test Mode Arbitration Logic Table B 420b. Note that in test mode the Outputs 320 depend only on the low priority inputs Input4 A and Input4 B.

In an embodiment, the Test Mode Select entry in the Functional Behavior Table 400 may comprise the Test Mode Select 126 and may be the product of the Test Enable1 122 signal and the Test Enable2 124 signal. In an embodiment, setting the Test Enable1 122 signal and the Test Enable2 124 signal both to '1', may indicate test mode. In an embodiment, (Input1 A, Input1 B) may indicate the Input 120 signal associated with the highest priority input port, (Input2 A, Input2 B) may indicate the Input 120 signal associated with the second highest priority input port, (Input3 A, Input3 B) may indicate the Input 120 signal associated with the third highest priority input port, (Input4 A, Input4 B) may indicate the Input 120 signal associated with the lowest priority input port, (Output1 A, Output1 B) may indicate the Output 160, and (Test Output1 A, Test Output1 B) may indicate the Test Output 165.

For example, in normal mode, if the Input1 A signal is '1', the PLM 140 may set the value of the Output1 A signal to '1', the value of the Output1 B signal to '0', the value of the Test Output1 A signal to '1' and the value of the Test Output1 B signal to '0', regardless of the values of the other inputs. In another example, in test mode, if the Input4 A signal is '1', the PLM 140 may set the value of the Output1 A signal to '1', the value of the Output1 B signal to '0', and the values of the test Output1 A signal and the Test Output1 B signal may be determined by the three higher priority inputs. It is understood that the Priority Logic 220 represented by the tables 410, 420a, and 420b can be changed by reprogramming the PLM 140. Further, it is understood that different PLMs 140 associated with the same Baseplate 135 and/or the same Priority Logic Component 130 may be programmed with different priority logic. Thus, different PLMs 140 associated with the same Baseplate 135 and/or the same Priority Logic Component 130 may each implement a different Functional Behavior Table 400.

As pointed out above, the depiction in FIG. 4 of the Functional Behavior Table 400 is a device for articulated and/or describing the behavior of the PLM 140 in an exemplary embodiment and does not imply any particular implementation of the represented functionality. In an embodiment, the priority logic represented conceptually in the Functional Behavior Table 400 may be implemented in VHDL statements, synthesized, and loaded into the complex programmable logic device of the PLM 140. For example, in an embodiment, the priority logic may be implemented by a series of VHDL statements that resemble the if-elsif-end structures of programming languages.

For example, a ROUT_VECT may define a two bit vector that drives the two regular outputs Output1 A and Output1 B and a TOUT_VECT may define a two bit vector that drives the two test outputs Test Output1 A and Test Output1 B. A two bit vector VECT may define an intermediate value that may conditionally be used in determining the ROUT-VECT and/or the TOUT_VECT. The VECT may be defined in a VHDL statement that resembles the if-elsif-end structures of programming languages as follows:

```
VECT <= "00" when input(7 downto 0) = "00000000" else
        "01" when input(7 downto 0) = "00000001" else
        "10" when input(7 downto 1) = "0000001" else
        "01" when input(7 downto 2) = "000001" else
        "10" when input(7 downto 3) = "00001" else
        "01" when input(7 downto 4) = "0001" else
        "10" when input(7 downto 5) = "001" else
        "01" when input(7 downto 6) = "01" else
        "10" when input(7)          = "1" ;
```

The "input" may comprise a vector of the Inputs 120, for example Input1 A, Input1 B, Input2 A, Input2 B, Input3 A, Input3 B, Input4 A, and Input4 B. A two bit vector ROUT_VECT may be defined in a VHDL statement that resembles the if-elsif-end structures of programming languages as follows:

```
ROUT_VECT <= VECT when TEST = '0' else
        "10" when IN4A_STAB = '1' else
        "01" when IN4A_STAB = '0' and IN4B_STAB = '1' else
        "00";
```

The "TEST" may be determined based on the Test Mode Select 126 such that when test is not selected, TEST equals a 0 value. The "IN4A_STAB" may comprise Input4 A and the "IN4B_STAB" may comprise the Input4 B of the Inputs 120. When the test mode of operation is not selected, the ROUT_VECT is assigned a value based on the intermediate value VECT, and consequently the Output1 A and Output1 B are driven in accordance with the normal mode priority logic. When the test mode of operation is selected, the ROUT_VECT is assigned a value based only on the fourth input, the low priority input, and consequently the Output1 A and Output1 B are driven by the low priority input. A two bit vector TOUT_VECT may be defined in a VHDL statement that resembles the if-elsif-end structures of programming languages:

```
TOUT_VECT <= VECT when TEST = '0' else
        "00" when input(7 downto 0) = "00000000" else
        "00" when input(7 downto 0) = "00000001" else
        "00" when input(7 downto 1) = "0000001" else
        "01" when input(7 downto 2) = "000001" else
        "10" when input(7 downto 3) = "00001" else
        "01" when input(7 downto 4) = "0001" else
        "10" when input(7 downto 5) = "001" else
        "01" when input(7 downto 6) = "01" else
        "10" when input(7)          = "1" ;
```

When the test mode of operation is not selected, the TOUT_VECT is assigned a value based on the intermediate value VECT, and consequently the Test Output1 A and the Test Output1 B are driven by the normal mode priority logic. When the test mode of operation is selected, the TOUT_VECT is assigned a value substantially similar to the values of VECT, except that when the Input1 A, Input1 B, Input2 A, Input2 B, Input3 A, and Input3 B are all zero values, the Test Output1 A and the Test Output1 B are both zero values notwithstanding the values of Input4 A and Input4 B.

It will be appreciated that the priorities that are defined by the VHDL fragments above may be readily revised by changing the VHDL fragments to encode different prioritizations and/or different truth tables. Also, it will be appreciated that the VHDL fragments above may not be complete and may rely upon additional VHDL statements in a practical encoding implementation.

Figure 5:
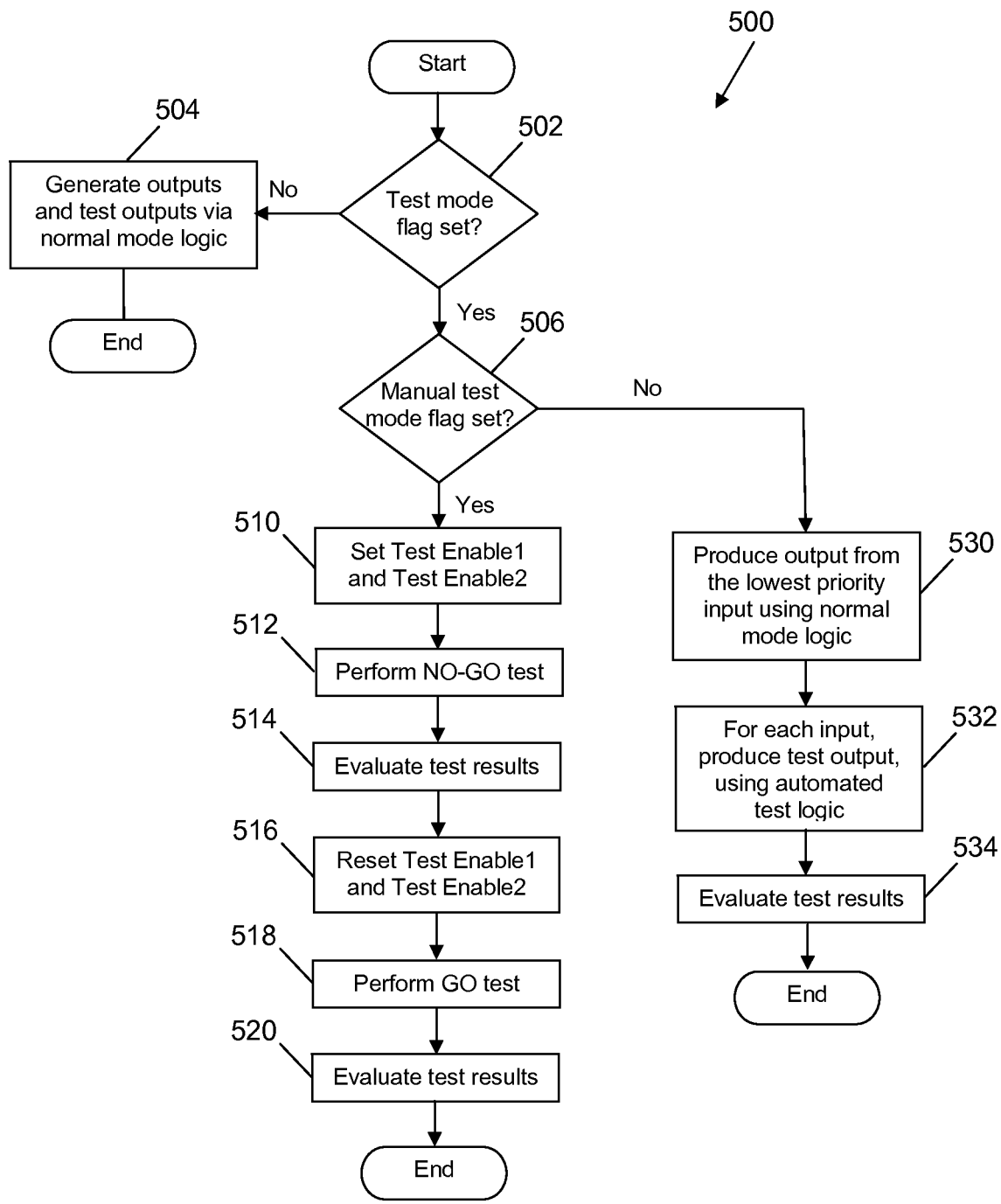
FIG. 5 is a flowchart of a testing method according to an embodiment of the disclosure.

FIG. 5 illustrates one embodiment of the Testing Method 500, which may be used to verify the correct operation of at least one component comprised in the Process Control System 100. For example, the Testing Method 500 may be implemented at least in part in a PLM 140. In an embodiment, each PLM 140 in the Process Control System 100 may implement the Testing Method 500 independently of the other PLMs 140 in the Process Control System 100.

The Testing Method 500 may begin at block 502, where the method may determine whether the test mode select signal is set. In an embodiment, the test mode select signal comprises the Test Mode Select 126. The Testing Method 500 may continue to block 506 if the condition in block 502 is met or to block 504 if the condition in block 502 is not met. At block 504, the Testing Method 500 may produce at least one Output 160 and a Test Output 165 using normal mode logic, for example mapping inputs to outputs using the Normal Mode Arbitration Logic Table 410, and the method may end. At block 506, the Testing Method 500 may determine whether the PLM 140 is operating in manual test mode. The Testing Method 500 may continue to block 510 if the condition in block 506 is met and may proceed to block 530 if the condition in block 506 is not met.

At block 510, the method may set a test enable signal. In an embodiment, setting the test enable signal may comprise setting both the Test Enable1 122 signal and the Test Enable2 124 signal to '1'. The method may then proceed to block 512 to perform the NO-GO test. In an embodiment, a NO-GO test comprises sending an Input 120 to the PLM 140 to produce a Test Output 165 and record a plurality of test results. In an embodiment, the NO-GO test may be performed for all Inputs 120 by configuring each Input 120 to activate an Actuating Device 180 associated with the Input 120. From block 512, the method may proceed to block 514 and may evaluate the test results from the NO-GO test. The method may continue to block 516 and reset the test enable signal. In an embodiment, resetting the test enable signal may comprise setting both the Test Enable1 122 signal and the Test Enable2 124 signal to '0'. The method may proceed to block 518, perform a GO test and proceed to block 520. In an embodiment, a GO test comprises sending an Input 120 to the PLM 140 to produce an Output 160 to an Actuating Device 180, verifying the activation of the Actuating Device 180 and recording a plurality of test results. At block 520, the Testing Method 500 may evaluate the test results from the GO test, and the method may end.

At block 530, the Testing Method 500 may produce a plurality of outputs from a plurality of inputs using test logic. In an embodiment, the Output 160 may be generated from the Input 120 that is associated with the lowest priority. In an embodiment, the Output 160 may be generated via the Test Mode Arbitration Logic Table B 420*b*. The method may continue to block 532, to produce a Test Output 165 for each Input 120, and record a plurality of test results. In an embodiment, the Test Output 165 may be generated via the Test Mode Arbitration Logic Table A 420*a*. The method may proceed to block 534, may evaluate the test results, and the method may end.

Figure 6:
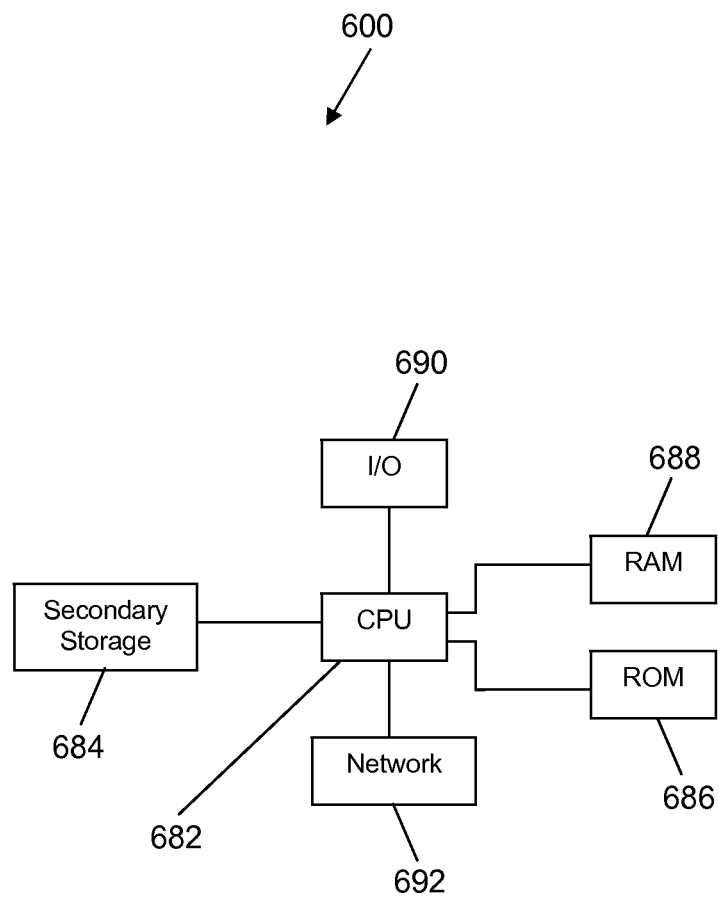
FIG. 6 illustrates an exemplary computer system according to an embodiment of the disclosure.

FIG. 6 illustrates a computer system 600 suitable for implementing one or more embodiments disclosed herein. The computer system 600 includes a processor 682 (which may be referred to as a central processor unit or CPU) that is in communication with memory devices including secondary storage 684, read only memory (ROM) 686, random access memory (RAM) 688, input/output (I/O) devices 690, and network connectivity devices 692. The processor 682 may be implemented as one or more CPU chips.

It is understood that by programming and/or loading executable instructions onto the computer system 600, at least one of the CPU 682, the RAM 688, and the ROM 686 are changed, transforming the computer system 600 in part into a particular machine or apparatus having the novel functionality taught by the present disclosure. It is fundamental to the electrical engineering and software engineering arts that functionality that can be implemented by loading executable software into a computer can be converted to a hardware implementation by well known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage 684 is typically comprised of one or more disk drives or tape drives and is used for non-volatile storage of data and as an over-flow data storage device if RAM 688 is not large enough to hold all working data. Secondary storage 684 may be used to store programs which are loaded into RAM 688 when such programs are selected for execution. The ROM 686 is used to store instructions and perhaps data which are read during program execution. ROM 686 is a non-volatile memory device which typically has a small memory capacity relative to the larger memory capacity of secondary storage 684. The RAM 688 is used to store volatile data and perhaps to store instructions. Access to both ROM 686 and RAM 688 is typically faster than to secondary storage 684. The secondary storage 684, the RAM 688, and/or the ROM 686 may be referred to in some contexts as non-transitory storage and/or non-transitory computer readable media.

I/O devices 690 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 692 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. These network connectivity devices 692 may enable the processor 682 to communicate with the Internet or one or more intranets. With such a network connection, it is contemplated that the processor 682 might receive information from the network, or might output information to the network in the course of performing the above-described method steps. Such information, which is often represented as a sequence of instructions to be executed using processor 682, may be received from and outputted to the network, for example, in the form of a computer data signal embodied in a carrier wave.

Such information, which may include data or instructions to be executed using processor 682 for example, may be received from and outputted to the network, for example, in the form of a computer data baseband signal or signal embodied in a carrier wave. The baseband signal or signal embodied in the carrier wave generated by the network connectivity devices 692 may propagate in or on the surface of electrical conductors, in coaxial cables, in waveguides, in an optical conduit, for example an optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, may be generated according to several methods well known to one skilled in the art. The baseband signal and/or signal embedded in the carrier wave may be referred to in some contexts as a transitory signal.

The processor 682 executes instructions, codes, computer programs, scripts which it accesses from hard disk, floppy disk, optical disk (these various disk based systems may all be considered secondary storage 684), ROM 686, RAM 688, or the network connectivity devices 692. While only one processor 682 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 684, for example, hard drives, floppy disks, optical disks, and/or other device, the ROM 686, and/or the RAM 688 may be referred to in some contexts as non-transitory instructions and/or non-transitory information.

In an embodiment, the computer system 600 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 600 to provide the functionality of a number of servers that is not directly bound to the number of computers in the computer system 600. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having computer usable program code embodied therein implementing the functionality disclosed above. The computer program product may comprise data, data structures, files, executable instructions, and other information. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 600, at least portions of the contents of the computer program product to the secondary storage 684, to the ROM 686, to the RAM 688, and/or to other non-volatile memory and volatile memory of the computer system 600. The processor 682 may process the executable instructions and/or data in part by directly accessing the computer program product, for example by reading from a CD-ROM disk inserted into a disk drive peripheral of the computer system 600. The computer program product may comprise instructions that promote the loading and/or copying of data, data structures, files, and/or executable instructions to the secondary storage 684, to the ROM 686, to the RAM 688, and/or to other non-volatile memory and volatile memory of the computer system 600.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. In a nuclear process control system, a priority logic module (PLM), comprising:

a plurality of input ports, each input port associated with one of a plurality of priorities, said plurality of input ports comprising four input ports, each configured to receive an input pair associated with a priority;

a plurality of output ports, said plurality of output ports comprising one output port configured to send one output pair to an actuating device and one test output port configured to send one test output pair to a test device;

a test mode select port associated with a test mode select signal, the test mode select signal selecting one of a normal mode or test mode, each mode being associated with matching signals received by the input ports to signals sent by the output ports;

a configurable priority logic, wherein the priority logic circuit maps one of the input ports to one of the output ports;

wherein the priority logic module is certified for use in a class 1E nuclear process control system, wherein the input ports are configured to receive class 1E signals comprising a plurality of input pairs, and wherein the output ports are configured to send signals comprising a plurality of output pairs;

wherein (Input1 A, Input1 B) is the input pair associated with the highest priority input port, wherein (Input2 A, Input2 B) is the input pair associated with the second highest priority input port, wherein (Input3 A, Input3 B) is the input pair associated with the third highest priority input port, wherein (Input4 A, Input4 B) is the input pair associated with the fourth highest priority input port, wherein Test Mode Select is a signal set to '0', wherein (Output1 A, Output1 B) is the output pair, wherein (Test Output1 A, Test Output1 B) is the test output pair, wherein the output pair and the test output pair are generated from the input pairs, and wherein the following table represents the functional behavior of the priority logic

| Input1 A | Input1 B | Input2 A | Input2 B | Input3 A | Input3 B | Input4 A | Input4 B | Test Mode Select | Output1 A | Output1 B | Test Output1 A | Test Output1 B |
|---|---|---|---|---|---|---|---|---|---|---|---|---|
| 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 1 | 0 | 1 |
| 0 | 0 | 0 | 0 | 0 | 0 | 1 | x | 0 | 1 | 0 | 1 | 0 |
| 0 | 0 | 0 | 0 | 0 | 1 | x | x | 0 | 0 | 1 | 0 | 1 |
| 0 | 0 | 0 | 0 | 1 | x | x | x | 0 | 1 | 0 | 1 | 0 |
| 0 | 0 | 0 | 1 | x | x | x | x | 0 | 0 | 1 | 0 | 1 |
| 0 | 0 | 1 | x | x | x | x | x | 0 | 1 | 0 | 1 | 0 |
| 0 | 1 | x | x | x | x | x | x | 0 | 0 | 1 | 0 | 1 |
| 1 | x | x | x | x | x | x | x | 0 | 1 | 0 | 1 | 0 | where '1' indicates a '1' signal, '0' indicates a '0' signal and an 'x' indicates a <don't care>.

2. The priority logic module of claim 1, wherein the priority logic module comprises a complex programmable logic device (CPLD).

3. The priority logic module of claim 1, wherein the priority logic is a component within the priority logic module, and wherein configuring the priority logic comprises modifying at least one logic component.

4. The priority logic module of claim 1, wherein the priority logic is configurable at manufacture time.

5. The priority logic module of claim 1, wherein the priority logic module is not field-programmable.

6. The priority logic module of claim 1, wherein the priority logic module further comprises a test output port.

7. The priority logic module of claim 1, wherein the priority logic module is configured to send at least one output signal produced from the input signal received by the input port associated with the lowest priority.

8. In a nuclear process control system, priority logic module (PLM), comprising:
  a plurality of input ports, each input port associated with one of a plurality of priorities, said plurality of input ports comprising four input ports, each configured to receive an input pair associated with a priority;
  a plurality of output ports, said plurality of output ports comprising one output port configured to send one output pair to an actuating device and one test output port configured to send one test output pair to a test device;
  a test mode select port associated with a test mode select signal, the test mode select signal selecting one of a normal mode or test mode, each mode being associated with matching signals received by the input ports to signals sent by the output ports;
  a configurable priority logic, wherein the priority logic circuit maps one of the input ports to one of the output ports;
  wherein the priority logic module is certified for use in a class 1E nuclear process control system, wherein the input ports are configured to receive class 1E signals comprising a plurality of input pairs, and wherein the output ports are configured to send signals comprising a plurality of output pairs;

wherein (Input1 A, Input1 B) is the input pair associated with the highest priority input port, wherein (Input2 A, Input2 B) is the input pair associated with the second highest priority input port, wherein (Input3 A, Input3 B) is the input pair associated with the third highest priority input port, wherein (Input4 A, Input4 B) is the input pair associated with the fourth highest priority input port, wherein Test Mode Select is a signal set to '1', wherein (Output1 A, Output1 B) is the output pair, wherein (Test Output1 A, Test Output1 B) is the test output pair, wherein the output pair and the test output pair are generated from the input pairs, and wherein the following tables represent the functional behavior of the priority logic

| Input1 A | Input1 B | Input2 A | Input2 B | Input3 A | Input3 B | Input4 A | Input4 B | Test Mode Select | Test Output1 A | Test Output1 B |
|---|---|---|---|---|---|---|---|---|---|---|
| 0 | 0 | 0 | 0 | 0 | 0 | 0 | 0 | 1 | 0 | 0 |
| 0 | 0 | 0 | 0 | 0 | 0 | 0 | 1 | 1 | 0 | 0 |
| 0 | 0 | 0 | 0 | 0 | 0 | 1 | x | 1 | 0 | 0 |
| 0 | 0 | 0 | 0 | 0 | 1 | x | x | 1 | 0 | 1 |
| 0 | 0 | 0 | 0 | 1 | x | x | x | 1 | 1 | 0 |
| 0 | 0 | 0 | 1 | x | x | x | x | 1 | 0 | 1 |
| 0 | 0 | 1 | x | x | x | x | x | 1 | 1 | 0 |
| 0 | 1 | x | x | x | x | x | x | 1 | 0 | 1 |
| 1 | x | x | x | x | x | x | x | 1 | 1 | 0 |

| Inputs | | Outputs | |
|---|---|---|---|
| Input4 A | Input4 B | Test Mode Select | Output1 A | Output1 B |
| 0 | 0 | 1 | 0 | 0 |
| 0 | 1 | 1 | 0 | 1 |
| 1 | x | 1 | 1 | 0 | where '1' indicates a '1' signal, '0' indicates a '0' signal and an 'x' indicates a <don't care>.

9. The priority logic module of claim 8, wherein the priority logic module comprises a complex programmable logic device (CPLD).

10. The priority logic module of claim 8, wherein the priority logic is a component within the priority logic module, and wherein configuring the priority logic comprises modifying at least one logic component.

11. The priority logic module of claim 8, wherein the priority logic is configurable at manufacture time.

12. The priority logic module of claim 8, wherein the priority logic module is not field-programmable.

13. The priority logic module of claim 8, wherein the priority logic module further comprises a test output port.

14. The priority logic module of claim 8, wherein the priority logic module is configured to send at least one output signal produced from the input signal received by the input port associated with the lowest priority.

15. A method for testing, comprising:
selecting a test mode from a test mode select signal;
receiving a plurality of input signals, wherein each input signal is a class 1E signal associated with a priority;
producing at least one output signal from the input signals;
producing an output signal from the lowest priority input signal;
producing a test output signal from the input signals;
sending the output signal to an actuating device;
sending the test output signal to a test device; and
configuring an arbitration logic;
wherein the method is implemented by a priority logic module (PLM), wherein the test mode select signal indicates normal mode or test mode, wherein the input signals comprise a plurality of input pairs, wherein the output signal comprises an output pair and wherein the test output signal comprises a test output pair;
wherein (Input1 A, Input1 B) is the input pair associated with the highest priority input port, wherein (Input2 A, Input2 B) is the input pair associated with the second highest priority input port, wherein (Input3 A, Input3 B) is the input pair associated with the third highest priority input port, wherein (Input4 A, Input4 B) is the input pair associated with the fourth highest priority input port, wherein Test Mode Select is a signal set to '0', wherein (Output1 A, Output1 B) is the output pair, wherein (Test Output1 A, Test Output1 B) is the test output pair, wherein the output pair and the test output pair are generated from the input pairs, and wherein the following table represents the functional behavior of the priority logic

| Input1 A | Input1 B | Input2 A | Input2 B | Input3 A | Input3 B | Input4 A | Input4 B | Test Mode Select | Output1 A | Output1 B | Test Output1 A | Test Output1 B |
|---|---|---|---|---|---|---|---|---|---|---|---|---|
| 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 1 | 0 | 1 |
| 0 | 0 | 0 | 0 | 0 | 0 | 1 | x | 0 | 1 | 0 | 1 | 0 |
| 0 | 0 | 0 | 0 | 0 | 1 | x | x | 0 | 0 | 1 | 0 | 1 |
| 0 | 0 | 0 | 0 | 1 | x | x | x | 0 | 1 | 0 | 1 | 0 |
| 0 | 0 | 0 | 1 | x | x | x | x | 0 | 0 | 1 | 0 | 1 |
| 0 | 0 | 1 | x | x | x | x | x | 0 | 1 | 0 | 1 | 0 |
| 0 | 1 | x | x | x | x | x | x | 0 | 0 | 1 | 0 | 1 |
| 1 | x | x | x | x | x | x | x | 0 | 1 | 0 | 1 | 0 | where '1' indicates a '1' signal, '0' indicates a '0' signal and an 'x' indicates a <don't care>.

16. A method for testing, comprising:
selecting a test mode from a test mode select signal;
receiving a plurality of input signals, wherein each input signal is a class 1E signal associated with a priority;
producing at least one output signal from the input signals;
producing an output signal from the lowest priority input signal;
producing a test output signal from the input signals;
sending the output signal to an actuating device;
sending the test output signal to a test device; and
configuring an arbitration logic;
wherein the method is implemented by a priority logic module (PLM), wherein the test mode select signal indicates normal mode or test mode, wherein the input signals comprise a plurality of input pairs, wherein the output signal comprises an output pair and wherein the test output signal comprises a test output pair;
wherein (Input1 A, Input1 B) is the input pair associated with the highest priority input port, wherein (Input2 A, Input2 B) is the input pair associated with the second highest priority input port, wherein (Input3 A, Input3 B) is the input pair associated with the third highest priority input port, wherein (Input4 A, Input4 B) is the input pair associated with the fourth highest priority input port, wherein Test Mode Select is a signal set to '1', wherein (Output1 A, Output1 B) is the output pair, wherein (Test Output1 A, Test Output1 B) is the test output pair, wherein the output pair and the test output pair are generated from the input pairs, and wherein the following tables represent the functional behavior of the priority logic

| Input1 A | Input1 B | Input2 A | Input2 B | Input3 A | Input3 B | Input4 A | Input4 B | Test Mode Select | Test Output1 A | Test Output1 B |
|---|---|---|---|---|---|---|---|---|---|---|
| 0 | 0 | 0 | 0 | 0 | 0 | 0 | 0 | 1 | 0 | 0 |
| 0 | 0 | 0 | 0 | 0 | 0 | 0 | 1 | 1 | 0 | 0 |
| 0 | 0 | 0 | 0 | 0 | 0 | 1 | x | 1 | 0 | 0 |
| 0 | 0 | 0 | 0 | 0 | 1 | x | x | 1 | 0 | 1 |
| 0 | 0 | 0 | 0 | 1 | x | x | x | 1 | 1 | 0 |
| 0 | 0 | 0 | 1 | x | x | x | x | 1 | 0 | 1 |
| 0 | 0 | 1 | x | x | x | x | x | 1 | 1 | 0 |
| 0 | 1 | x | x | x | x | x | x | 1 | 0 | 1 |
| 1 | x | x | x | x | x | x | x | 1 | 1 | 0 | wherein the functional behavior of the output pair is represented in the following table

| Inputs | | | Outputs | |
|---|---|---|---|---|
| Input4 A | Input4 B | Test Mode Select | Output1 A | Output1 B |
| 0 | 0 | 1 | 0 | 0 |
| 0 | 1 | 1 | 0 | 1 |
| 1 | x | 1 | 1 | 0 | where '1' indicates a '1' signal, '0' indicates a '0' signal and an 'x' indicates a <don't care>.

* * * * *